(12) United States Patent
Kwon et al.

(10) Patent No.: US 8,987,342 B2
(45) Date of Patent: Mar. 24, 2015

(54) PHOTOSENSITIVE RESIN COMPOSITION FOR INSULATING FILM OF DISPLAY DEVICE, INSULATING FILM USING THE SAME, AND DISPLAY DEVICE USING THE SAME

(71) Applicant: Cheil Industries Inc., Gumi-si (KR)

(72) Inventors: Ji-Yun Kwon, Uiwang-si (KR); Jin-Hee Kang, Uiwang-si (KR); Dae-Yun Kim, Uiwang-si (KE); Sang-Kyeon Kim, Uiwang-si (KR); Sang-Soo Kim, Uiwang-si (KR); Yong-Tae Kim, Uiwang-si (KR); Kun-Bae Noh, Uiwang-si (KR); Eun-Bi Park, Uiwang-si (KR); Jae-Hwan Song, Uiwang-si (KR); Eun-Kyoung Youn, Uiwang-si (KR); Jong-Hwa Lee, Uiwang-si (KR); Jin-Young Lee, Uiwang-si (KR); Chung-Beum Hong, Uiwang-si (KR); Eun-Ha Hwang, Uiwang-si (KR); In-Chul Hwang, Uiwang-si (KR)

(73) Assignee: Cheil Industries Inc., Gumi-si (KR)

( * ) Notice: Subject to any disclaimer, the term of this patent is extended or adjusted under 35 U.S.C. 154(b) by 0 days.

(21) Appl. No.: 13/962,153

(22) Filed: Aug. 8, 2013

(65) Prior Publication Data

US 2014/0186768 A1 Jul. 3, 2014

(30) Foreign Application Priority Data

Dec. 28, 2012 (KR) .......................... 10-2012-0157564

(51) Int. Cl.
| | | |
|---|---|---|
| C08F 2/50 | (2006.01) | |
| C08F 2/46 | (2006.01) | |
| B29C 71/04 | (2006.01) | |
| A61L 2/08 | (2006.01) | |
| A61L 24/00 | (2006.01) | |
| C08G 61/04 | (2006.01) | |
| G03F 7/038 | (2006.01) | |

(52) U.S. Cl.
CPC ...................... *G03F 7/038* (2013.01)
USPC ...... 522/6; 522/1; 522/71; 522/189; 522/184; 520/1

(58) Field of Classification Search
CPC ............ C08F 2/50; C08F 8/00; C08F 220/18; C08L 33/08
USPC .......................... 522/6, 1, 71, 189, 184; 520/1
See application file for complete search history.

(56) References Cited

U.S. PATENT DOCUMENTS

| | | | |
|---|---|---|---|
| 2,797,213 A | 6/1957 | Moore | |
| 3,669,658 A | 6/1972 | Yonezawa et al. | |
| 8,080,350 B2 * | 12/2011 | Banba et al. | 430/14 |
| 2010/0193971 A1 * | 8/2010 | Banba et al. | 257/788 |
| 2010/0216070 A1 * | 8/2010 | Yamanaka et al. | 430/270.1 |
| 2011/0159428 A1 | 6/2011 | Lee et al. | |
| 2011/0200937 A1 * | 8/2011 | Orihara et al. | 430/270.1 |

FOREIGN PATENT DOCUMENTS

| | | |
|---|---|---|
| JP | 63-96162 | 4/1988 |
| JP | 06-060140 A | 8/1994 |
| JP | 09-302221 A | 11/1997 |
| JP | 10-307393 A | 11/1998 |
| JP | 2000-292913 A | 10/2000 |
| KR | 10-2009-0027161 A | 3/2009 |
| KR | 10-2009-0051761 A | 5/2009 |
| KR | 10-2010-0080343 A | 7/2010 |
| KR | 10-2011-0076492 A | 7/2011 |
| KR | 10-2012-0092023 A | 8/2012 |

* cited by examiner

*Primary Examiner* — Ling Choi
*Assistant Examiner* — Jessica E Whiteley
(74) *Attorney, Agent, or Firm* — Additon, Higgins & Pendleton, P.A.

(57) ABSTRACT

A photosensitive resin composition for an insulating film of a display device includes (A) an alkali soluble resin including a polybenzoxazole precursor, polyamic acid, polyimide, or a combination thereof; (B) a photosensitive diazoquinone compound; (C) an ultraviolet (UV) absorber having a maximum absorption wavelength of about 300 to about 400 nm; and (D) a solvent. An insulating film and a display device can include the photosensitive resin composition.

6 Claims, 1 Drawing Sheet

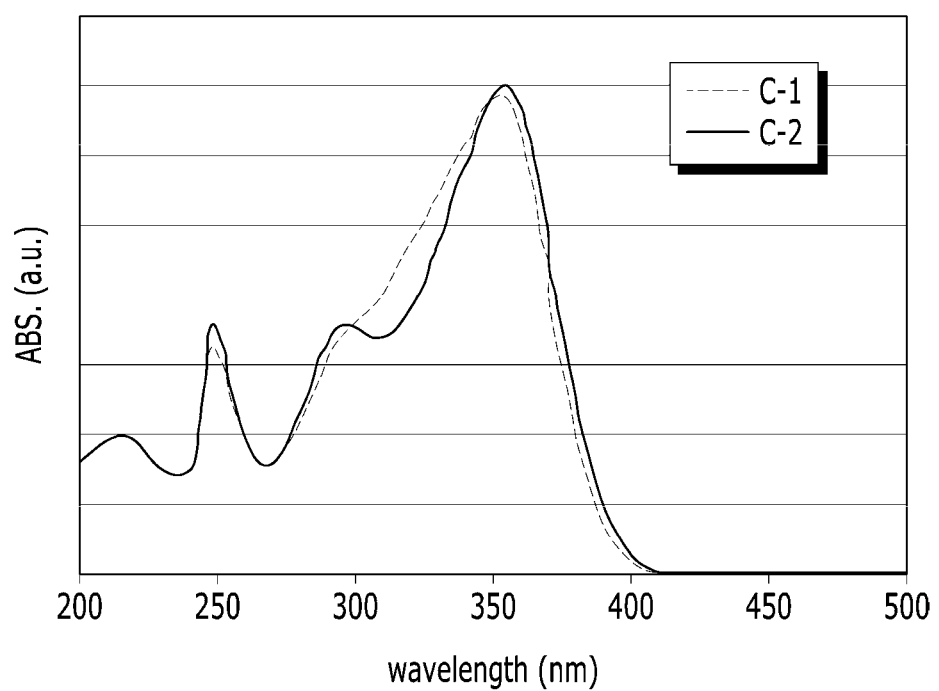

PHOTOSENSITIVE RESIN COMPOSITION FOR INSULATING FILM OF DISPLAY DEVICE, INSULATING FILM USING THE SAME, AND DISPLAY DEVICE USING THE SAME

CROSS-REFERENCE TO RELATED APPLICATION

This application claims priority to and the benefit of Korean Patent Application No. 10-2012-0157564 filed in the Korean Intellectual Property Office on Dec. 28, 2012, the entire disclosure of which is incorporated herein by reference.

FIELD OF THE INVENTION

This disclosure relates to a photosensitive resin composition for an insulating film of a display device, and an insulating film of a display device and a display device using the same.

BACKGROUND OF THE INVENTION

Conventionally, a surface protective layer and an interlayer insulating film for a semiconductor device use a polyimide resin having excellent heat resistance, electrical characteristics, mechanical characteristics, and the like. The polyimide resin has recently been used as a photosensitive polyimide precursor composition. The photosensitive polyimide precursor composition can be easily coated on a semiconductor device, patterned by ultraviolet (UV) rays, developed, and heat-imidized, to thereby form a surface protective layer, an interlayer insulating film, and the like.

Accordingly, the photosensitive polyimide precursor composition may remarkably shorten processing time compared with a conventional non-photosensitive polyimide precursor composition.

The photosensitive polyimide precursor composition can be applied as a positive type in which an exposed part is developed and dissolved or as a negative type in which the exposed part is cured and maintained. The positive type photosensitive polyimide precursor composition is preferably used, since a non-toxic alkali aqueous solution is used as a development solution. The positive photosensitive polyimide precursor composition includes a polyimide precursor of polyamic acid, a photosensitive material of diazonaphthoquinone, and the like.

However, the positive photosensitive polyimide precursor composition may not provide the desired pattern because the carboxylic acid of the polyamic acid is too highly soluble in an alkali. In order to solve this problem, the carboxylic acid can be replaced with phenolic hydroxyl acid, for example, by esterificating the polyamidic acid with an alcohol compound having at least one hydroxyl group. See Japanese Patent Laid-Open Publication No. H10-30739. This material, however, can be insufficiently developed and can exhibit film loss or resin delamination from a substrate.

Recently, another material prepared by mixing the polybenzoxazole precursor with a diazonaphthoquinone compound has drawn attention (Japanese Patent Laid-open Publication No. S63-96162). However, when actually used as the polybenzoxazole precursor composition, film loss of an unexposed part is remarkably increased, and the desirable pattern may not be obtained after development.

In order to improve this problem, if the molecular weight of the polybenzoxazole precursor is increased, the film loss of the unexposed part can be reduced. A residue (a scum), however, can be generated during development, which can deteriorate resolution and increase development time on the exposed part.

In order to solve the problem, addition of a certain phenol compound to a polybenzoxazole precursor composition has been reported to suppress film loss in unexposed parts during development (Japanese Patent Laid-Open Publication No. H9-302221 and Japanese Patent Laid-Open Publication No. 2000-292913). However, the suppression of the film loss in unexposed parts is insufficient.

Accordingly, research on increasing the suppression of the film loss as well as preventing generation of the development residue (scum) is required. In addition, research on a dissolution-inhibiting agent is required, since a phenol compound used to adjust solubility can decompose at a high temperature during curing, can cause a side reaction, and the like and as a result, can damage the mechanical properties of a cured film.

The positive photosensitive resin composition including a polybenzoxazole precursor may also be applied to an organic insulating film or a barrier rib material in the field of display devices. For example, a liquid crystal display can have advantages such as lightness, thinness, low cost, low power consumption for operation, excellent adherence to an integrated circuit, and the like and is increasingly used in laptop computers, monitors, and TV screens.

The liquid crystal display includes a lower substrate having a black matrix, a color filter, and an ITO pixel electrode, an active circuit portion including a liquid crystal layer, a thin film transistor, and a capacitor layer, and an upper substrate having an ITO pixel electrode.

With regard to recently developed organic light emitting diodes (OLEDs), each organic light emitting element is arranged as pixels in a matrix format. These pixels may be arranged to emit the same color and fabricate a single color display, or arranged into three primary colors of red (R), green (G), and blue (B) to emit various colors.

SUMMARY OF THE INVENTION

On embodiment of the present invention provides a photosensitive resin composition for an insulating film of a display device that can have an improved film residue ratio, sensitivity, and/or dielectric constant and a low residue occurrence rate of an exposure part.

Another embodiment of the present invention provides an insulating film of a display device using the photosensitive resin composition for an insulating film of a display device.

Yet another embodiment of the present invention provides a display device including the insulating film of a display device.

According to one embodiment of the present invention, provided is a photosensitive resin composition for an insulating film of a display device includes (A) an alkali soluble resin including a polybenzoxazole precursor, polyamic acid, polyimide, or a combination thereof; (B) a photosensitive diazoquinone compound; (C) an ultraviolet (UV) absorber having a maximum absorption wavelength of about 300 to about 400 nm; and (D) a solvent.

The ultraviolet (UV) absorber (C) may include a benzophenone-based compound, an acetophenone-based compound, a thioxanthone-based compound, a benzoin-based compound, a triazine-based compound, an oxime-based compound, or a combination thereof.

The photosensitive resin composition for an insulating film of a display device may include about 5 to about 100 parts by weight of the photosensitive diazoquinone compound (B); about 0.1 to about 5 parts by weight of the ultraviolet (UV)

absorber (C); and about 100 to about 900 parts by weight of the solvent (D), based on about 100 parts by weight of the alkali soluble resin (A).

The photosensitive resin composition for an insulating film of a display device may further include a silane compound.

The photosensitive resin composition for an insulating film of a display device may further include a phenol compound.

According to another embodiment of the present invention, provided is an insulating film of a display device manufactured using the photosensitive resin composition for an insulating film of a display device.

According to yet another embodiment of the present invention, a display device including the insulating film of a display device is provided.

The photosensitive resin composition for an insulating film of a display device and an insulating film of a display device formed of the photosensitive resin composition and a display device fabricated using the same may have an improved film residue ratio, sensitivity, and/or a dielectric constant but a low residue occurrence rate in an exposed part.

BRIEF DESCRIPTION OF THE DRAWING

FIG. 1 shows the ultraviolet (UV) absorption spectrum of an ultraviolet (UV) absorber according to one embodiment of the present invention.

DETAILED DESCRIPTION

The present invention will be described more fully hereinafter in the following detailed description of the invention, in which some but not all embodiments of the invention are described. Indeed, this invention may be embodied in many different forms and should not be construed as limited to the embodiments set forth herein; rather, these embodiments are provided so that this disclosure will satisfy applicable legal requirements.

As used herein, when a specific definition is not otherwise provided, the term "substituted" refers to one substituted with at least a substituent including halogen (—F, —Cl, —Br or —I), a hydroxy group, a nitro group, a cyano group, an amino group ($NH_2$, $NH(R^{200})$ or $N(R^{201})(R^{202})$, wherein $R^{200}$, $R^{201}$ and $R^{202}$ are the same or different and are each independently C1 to C10 alkyl), an amidino group, a hydrazine group, a hydrazine group, a carboxyl group, substituted or unsubstituted alkyl, substituted or unsubstituted alkenyl, substituted or unsubstituted alkynyl, a substituted or unsubstituted alicyclic organic group, substituted or unsubstituted aryl, a substituted or unsubstituted heterocyclic group, or a combination thereof.

As used herein, when a specific definition is not otherwise provided, the term "alkyl" refers to C1 to C30 alkyl, for example C1 to C15 alkyl, the term "cycloalkyl" refers to C3 to C30 cycloalkyl, for example C3 to C18 cycloalkyl, the term "alkoxy" refers to C1 to C30 alkoxy, for example C1 to C18 alkoxy, the term "aryl" refers to C6 to C30 aryl, for example C6 to C18 aryl, the term "alkenyl" refers to C2 to C30 alkenyl, for example C2 to C18 alkenyl, the term "alkylene" refers to C1 to C30 alkylene, for example C1 to C18 alkylene, and the term "arylene" refers to C6 to C30 arylene, for example C6 to C16 arylene.

As used herein, when a specific definition is not otherwise provided, the term "aliphatic organic group" refers to C1 to C30 alkyl, C2 to C30 alkenyl, C2 to C30 alkynyl, C1 to C30 alkylene, C2 to C30 alkenylene, or C2 to C30 alkynylene, for example C1 to C15 alkyl, C2 to C15 alkenyl, C2 to C15 alkynyl, C1 to C15 alkylene, C2 to C15 alkenylene, or C2 to C15 alkynylene, the term "alicyclic organic group" refers to C3 to C30 cycloalkyl, C3 to C30 cycloalkenyl, C3 to C30 cycloalkynyl, C3 to C30 cycloalkylene, C3 to C30 cycloalkenylene, or C3 to C30 cycloalkynylene, for example C3 to C15 cycloalkyl, C3 to C15 cycloalkenyl, C3 to C15 cycloalkynyl, C3 to C15 cycloalkylene, C3 to C15 cycloalkenylene, or C3 to C15 cycloalkynylene, the term "aromatic organic group" refers to C6 to C30 aryl or C6 to C30 arylene, for example C6 to C16 aryl or C6 to C16 arylene, the term "heterocyclic group" refers to C2 to C30 heterocycloalkyl, C2 to C30 heterocycloalkylene, C2 to C30 heterocycloalkenyl, C2 to C30 heterocycloalkenylene, C2 to C30 heterocycloalkynyl, C2 to C30 heterocycloalkynylene, C2 to C30 heteroaryl, or C2 to C30 heteroarylene that includes 1 to 3 hetero atoms including O, S, N, P, Si, or a combination thereof in a ring, for example C2 to C15 heterocycloalkyl, C2 to C15 heterocycloalkylene, C2 to C15 heterocycloalkenyl, C2 to C15 heterocycloalkenylene, C2 to C15 heterocycloalkynyl, C2 to C15 heterocycloalkynylene, C2 to C15 heteroaryl, or C2 to C15 heteroarylene that include 1 to 3 hetero atoms including O, S, N, P, Si, or a combination thereof in a ring.

One embodiment of the present invention provides a photosensitive resin composition for an insulating film of a display device that includes (A) an alkali soluble resin including a polybenzoxazole precursor, polyamic acid, polyimide, or a combination thereof; (B) a photosensitive diazoquinone compound; (C) an ultraviolet (UV) absorber having maximum absorption wavelength of about 300 to about 400 nm; and (D) a solvent.

The photosensitive resin composition for an insulating film of a display device may be a positive photosensitive resin composition.

Hereinafter, each component of the photosensitive resin composition for an insulating film of a display device is described.

(A) Alkali Soluble Resin

The alkali soluble resin (A) may be any generally-used alkali soluble resin in the art of the present invention without limitation. Examples of, the alkali soluble resin may include without limitation polybenzoxazole precursors including a repeating unit represented by the following Chemical Formula 1, polyamic acids including a repeating unit represented by the following Chemical Formula 2, polyimides including a repeating unit represented by the following Chemical Formula 3, and the like, and combinations thereof.

Polybenzoxazole Precursor

[Chemical Formula 1]

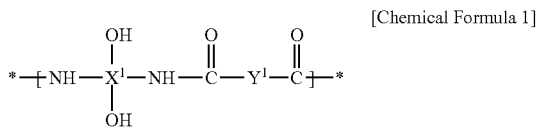

In Chemical Formula 1, $X^1$ is a substituted or unsubstituted C6 to C30 aromatic organic group, and $Y^1$ is a substituted or unsubstituted C6 to C30 aromatic organic group, a substituted or unsubstituted divalent to hexavalent C1 to C30 aliphatic organic group, or a substituted or unsubstituted divalent to hexavalent C3 to C30 alicyclic organic group.

In Chemical Formula 1, $X^1$ may be an aromatic organic group which is a residual group derived from aromatic diamine.

Examples of the aromatic diamine may include without limitation 3,3'-diamino-4,4'-dihydroxybiphenyl, 4,4'-diamino-3,3'-dihydroxybiphenyl, bis(3-amino-4-hydroxyphenyl)propane, bis(4-amino-3-hydroxyphenyl)propane, bis(3-amino-4-hydroxyphenyl)sulfone, bis(4-amino-3-hydroxyphenyl)sulfone, 2,2-bis(3-amino-4-hydroxyphenyl)-1,1,1,3,3,3-hexafluoropropane, 2,2-bis(4-amino-3-hydroxyphenyl)-1,1,1,3,3,3-hexafluoropropane, 2,2-bis(3-amino-4-hydroxy-5-trifluoromethylphenyl)hexafluoropropane, 2,2-bis(3-amino-4-hydroxy-6-trifluoromethylphenyl)hexafluoropropane, 2,2-bis(3-amino-4-hydroxy-2-trifluoromethylphenyl)hexafluoropropane, 2,2-bis(4-amino-3-hydroxy-5-trifluoromethylphenyl)hexafluoropropane, 2,2-bis(4-amino-3-hydroxy-6-trifluoromethylphenyl)hexafluoropropane, 2,2-bis(4-amino-3-hydroxy-2-trifluoromethylphenyl)hexafluoropropane, 2,2-bis(3-amino-4-hydroxy-5-pentafluoroethylphenyl)hexafluoropropane, 2-(3-amino-4-hydroxy-5-trifluoromethylphenyl)-2-(3-amino-4-hydroxy-5-pentafluoroethylphenyl)hexafluoropropane, 2-(3-amino-4-hydroxy-5-trifluoromethylphenyl)-2-(3-hydroxy-4-amino-5-trifluoromethylphenyl)hexafluoropropane, 2-(3-amino-4-hydroxy-5-trifluoromethylphenyl)-2-(3-hydroxy-4-amino-6-trifluoromethylphenyl)hexafluoropropane, 2-(3-amino-4-hydroxy-5-trifluoromethylphenyl)-2-(3-hydroxy-4-amino-2-trifluoromethylphenyl)hexafluoropropane, 2-(3-amino-4-hydroxy-2-trifluoromethylphenyl)-2-(3-hydroxy-4-amino-5-trifluoromethylphenyl)hexafluoropropane, 2-(3-amino-4-hydroxy-6-trifluoromethylphenyl)-2-(3-hydroxy-4-amino-5-trifluoromethylphenyl)hexafluoropropane, and the like, and combinations thereof.

In Chemical Formula 1, $Y^1$ is an aromatic organic group, divalent to hexavalent aliphatic organic group, or divalent to hexavalent alicyclic organic group, and may be a residual group of dicarboxylic acid or a residual group of a dicarboxylic acid derivative. For example, $Y^1$ may be an aromatic organic group or a divalent to hexavalent alicyclic organic group.

Examples of the dicarboxylic acid include may include without limitation $Y^1(COOH)_2$ (wherein $Y^1$ is the same as $Y^1$ of the above Chemical Formula 1).

Examples of the carboxylic acid derivative may include without limitation carbonyl halide derivatives of the dicarboxylic acid derivative or active compounds of an active ester derivative obtained by reacting $Y^1(COOH)_2$ with 1-hydroxy-1,2,3-benzotriazole (wherein $Y^1$ is the same as $Y^1$ of the above Chemical Formula 1).

Examples of the dicarboxylic acid derivative may include without limitation 4,4'-oxydibenzoyl chloride, diphenyloxydicarbonyl dichloride, bis(phenylcarbonylchloride)sulfone, bis(phenylcarbonylchloride)ether, bis(phenylcarbonylchloride)phenone, phthaloyl dichloride, terephthaloyl dichloride, isophthaloyl dichloride, dicarbonyldichloride, diphenyloxydicarboxylate dibenzotriazole, and the like, and combinations thereof.

The polybenzoxazole precursor may have a thermally polymerizable functional group derived from a reactive end-capping monomer, at one terminal end or both terminal ends of the branch. Examples of the reactive end-capping monomer may include without limitation monoamines, monoanhydrides, and the like, and combinations thereof having a carbon-carbon double bond. Examples of the monoamines may include without limitation toluidine, dimethylaniline, ethylaniline, aminophenol, aminobenzylalcohol, aminoindan, aminoacetonephenone, and the like, and combinations thereof.

Polyamic Acid and Polyimide

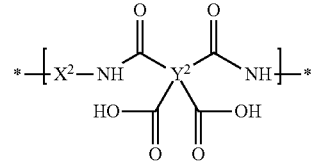

[Chemical Formula 2]

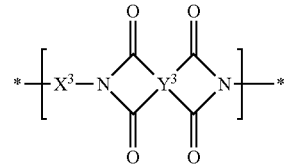

[Chemical Formula 3]

In Chemical Formulae 2 and 3, $X^2$ and $X^3$ are the same or different and are each independently a substituted or unsubstituted C6 to C30 aromatic organic group, substituted or unsubstituted divalent to hexavalent C1 to C30 aliphatic organic group, substituted or unsubstituted divalent to hexavalent C3 to C30 alicyclic organic group, or an organic silane group.

In the above Chemical Formulae 2 and 3, $X^2$ and $X^3$ the same or different and each can be independently a residual group derived from aromatic diamine, alicyclic diamine, and/or silicon diamine. The aromatic diamine, alicyclic diamine, and silicon diamine may be used singularly or as a mixture of one or more.

Examples of the aromatic diamine may include without limitation 3,4'-diaminodiphenylether, 4,4'-diaminodiphenylether, 3,4'-diaminodiphenylmethane, 4,4'-diaminodiphenylmethane, 4,4'-diaminodiphenylsulfone, 4,4'-diaminodiphenylsulfide, benzidine, m-phenylenediamine, p-phenylenediamine, 1,5-naphthalenediamine, 2,6-naphthalenediamine, bis[4-(4-aminophenoxy)phenyl]sulfone, bis(3-aminophenoxyphenyl)sulfone, bis(4-aminophenoxy)biphenyl, bis[4-(4-aminophenoxy)phenyl]ether, 1,4-bis(4-aminophenoxy)benzene, the forgoing compounds including an aromatic ring substituted with an alkyl group or a halogen, and the like, and combinations thereof.

Examples of the alicyclic diamine may include without limitation 1,2-cyclohexyl diamine, 1,3-cyclohexyl diamine, and the like, and combinations thereof.

Examples of the silicon diamine may include without limitation bis(4-aminophenyl)dimethylsilane, bis(4-aminophenyl)tetramethylsiloxane, bis(p-aminophenyl)tetramethyldisiloxane, bis(γ-aminopropyl)tetramethyldisiloxane, 1,4-bis(γ-aminopropyldimethylsilyl)benzene, bis(4-aminobutyl)tetramethyldisiloxane, bis(γ-aminopropyl)tetraphenyldisiloxane, 1,3-bis(aminopropyl)tetramethyldisiloxane, and the like, and combinations thereof.

In the above Chemical Formulae 2 and 3, $Y^2$ and $Y^3$ are the same or different and are each independently a substituted or unsubstituted C6 to C30 aromatic organic group, substituted or unsubstituted tetravalent to hexavalent C1 to C30 aliphatic organic group, or substituted or unsubstituted tetravalent to hexavalent C3 to C30 alicyclic organic group.

The $Y^2$ and $Y^3$ may be independently residual groups derived from aromatic acid dianhydride or alicyclic acid dianhydride. The aromatic acid dianhydride and the alicyclic acid dianhydride may be used singularly or as a mixture of more than one.

Examples of the aromatic acid dianhydride may include without limitation benzophenone tetracarboxylic dianhydrides such as pyromellitic dianhydride; benzophenone-3,3',4,4'-tetracarboxylic dianhydride, and the like; oxydiphthalic dianhydrides such as 4,4'-oxydiphthalic dianhydride; biphthalic dianhydride such as 3,3',4,4'-biphthalic dianhydride; (hexafluoroisopropyledene)diphthalic dianhydrides such as 4,4'-(hexafluoroisopropyledene)diphthalic dianhydride; naphthalene-1,4,5,8-tetracarboxylic dianhydride; 3,4,9,10-perylenetetracarboxylic dianhydride, and the like, and combinations thereof.

Examples of the alicyclic acid dianhydride may include without limitation 1,2,3,4-cyclobutanetetracarboxylic dianhydride, 1,2,3,4-cyclopentanetetracarboxylic dianhydride, 5-(2,5-dioxotetrahydrofuryl)-3-methyl-cyclohexane-1,2-dicarboxylic anhydride, 4-(2,5-dioxotetrahydrofuran-3-yl)-tetralin-1,2-dicarboxylic anhydride, bicyclooctene-2,3,5,6-tetracarboxylic dianhydride, bicyclooctene-1,2,4,5-tetracarboxylic dianhydride, and the like, and combinations thereof.

The alkali soluble resin may have a weight average molecular weight (Mw) of about 5,000 to about 20,000 g/mol, for example about 6,000 to about 10,000 g/mol. Within the above weight average molecular weight (Mw), the alkali soluble resin may exhibit sufficient film residue ratios of non-exposed parts during development using an alkali aqueous solution, and patterning may be performed efficiently.

(B) Photosensitive Diazoquinone Compound

The photosensitive diazoquinone compound may be a compound having a 1,2-benzoquinone diazide structure and/or 1,2-naphthoquinone diazide structure.

The photosensitive diazoquinone compound may include at least one compound represented by the following Chemical Formulae 4, and 6 to 8, and combinations thereof, but is not limited thereto.

[Chemical Formula 4]

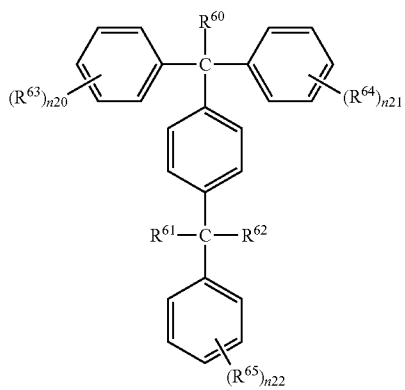

In Chemical Formula 4, $R^{60}$ to $R^{62}$ are the same or different and are each independently hydrogen or substituted or unsubstituted C1 to C30 alkyl, for example methyl.

In Chemical Formula 4, $R^{63}$ to $R^{65}$ are the same or different and are each independently OQ, wherein Q is hydrogen, a functional group represented by the following Chemical Formula 5a or a functional group represented by the following Chemical Formula 5b, provided that all Qs are not simultaneously hydrogen In Chemical Formula 4, $n^{20}$ to $n^{22}$ may be the same or different and are each independently integers of 0 to 5.

[Chemical Formula 5a]

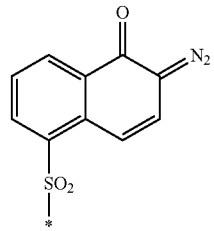

[Chemical Formula 5b]

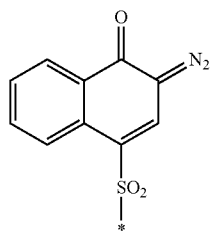

[Chemical Formula 6]

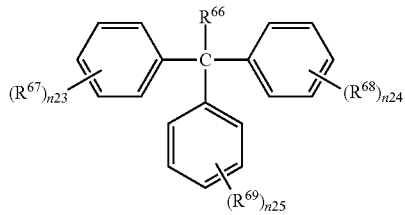

In Chemical Formula 6, $R^{66}$ is hydrogen or substituted or unsubstituted C1 to C30 alkyl, $R^{67}$ to $R^{69}$ are the same or different and are each independently OQ, wherein Q is the same as defined in the above, and $n^{23}$ to $n^{25}$ are the same or different and are each independently integers of 0 to 5.

[Chemical Formula 7]

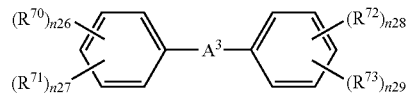

In Chemical Formula 7, $A^3$ is CO or $CR^{74}R^{75}$, wherein $R^{74}$ and $R^{75}$ are the same or different and are each independently substituted or unsubstituted C1 to C30 alkyl.

In Chemical Formula 7, $R^{70}$ to $R^{73}$ are the same or different and are each independently hydrogen, substituted or unsubstituted C1 to C30 alkyl, OQ, or NHQ, wherein Q is the same as defined in the above.

In Chemical Formula 7, $n^{26}$ to $n^{29}$ are the same or different and are each integers ranging from 0 to 4, and each $n^{26}+n^{27}$ and $n^{28}+n^{29}$ is an integer of less than or equal to 5.

At least one of $R^{70}$ and $R^{71}$ is OQ, and one aromatic ring includes one to three OQs and the other aromatic ring includes one to four OQs.

[Chemical Formula 8]

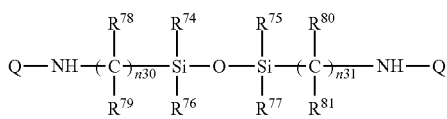

In Chemical Formula 8, $R^{74}$ to $R^{81}$ are the same or different and are each independently hydrogen or substituted or unsubstituted C1 to C30 alkyl, $n^{30}$ and $n^{31}$ are the same or different and are each an integer of 1 to 5, and Q is the same as defined above.

The photosensitive resin composition may include the photosensitive diazoquinone compound in an amount of about 5 to about 100 parts by weight, for example about 10 to about 50 parts by weight, based on about 100 parts by weight of the alkali soluble resin (A). In some embodiments, the photosensitive resin composition may include the photosensitive diazoquinone compound in an amount of about 5, 6, 7, 8, 9, 10, 11, 12, 13, 14, 15, 16, 17, 18, 19, 20, 21, 22, 23, 24, 25, 26, 27, 28, 29, 30, 31, 32, 33, 34, 35, 36, 37, 38, 39, 40, 41, 42, 43, 44, 45, 46, 47, 48, 49, 50, 51, 52, 53, 54, 55, 56, 57, 58, 59, 60, 61, 62, 63, 64, 65, 66, 67, 68, 69, 70, 71, 72, 73, 74, 75, 76, 77, 78, 79, 80, 81, 82, 83, 84, 85, 86, 87, 88, 89, 90, 91, 92, 93, 94, 95, 96, 97, 98, 99 or 100 parts by weight. Further, according to some embodiments of the present invention, the amount of the photosensitive diazoquinone compound can be in a range from about any of the foregoing amounts to about any other of the foregoing amounts.

When the photosensitive resin composition includes the photosensitive diazoquinone compound in an amount within the above range, the pattern can be well-formed with minimal or no residue from exposure, and film thickness loss during development may be minimized or prevented and thereby a good pattern can be provided.

(C) Ultraviolet (UV) Absorber

The photosensitive resin composition for an insulating film of a display device according to one embodiment includes an ultraviolet (UV) absorber (C) having a maximum absorption wavelength ranging from about 300 to about 400 nm, for example about 350 to about 380 nm. Specifically, the ultraviolet (UV) absorber may be an i-line absorber. The i-line absorber has a maximum absorption wavelength of about 365 nm.

The ultraviolet (UV) absorber absorbing a light within the above wavelength range may effectively regulate developability (a development rate) balance of the photosensitive resin composition for an insulating film of a display device and sensitivity.

Examples of the ultraviolet (UV) absorber (C) may include without limitation benzophenone-based compounds, acetophenone-based compounds, thioxanthone-based compounds, benzoin-based compounds, triazine-based compounds, oxime-based compounds, and the like, and combinations thereof. Among the compounds, a compound having a maximum absorption wavelength ranging from about 300 to about 400 nm may be appropriately selected.

Examples of the benzophenone-based compound may include without limitation benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 4,4'-dichlorobenzophenone, 3,3'-dimethyl-2-methoxybenzophenone, and the like, and combinations thereof.

Examples of the acetophenone-based compound may include without limitation 2,2'-diethoxyacetophenone, 2,2'-dibutoxyacetophenone, 2-hydroxy-2-methylpropinophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-dimethylamino-1-(4-morpholinophenyl)-butan-1-one, and the like, and combinations thereof.

Examples of the thioxanthone-based compound may include without limitation thioxanthone, 2-methylthioxanthone, isopropyl thioxanthone, 2,4-diethyl thioxanthone, 2,4-diisopropyl thioxanthone, 2-chlorothioxanthone, and the like, and combinations thereof.

Examples of the benzoin-based compound may include without limitation benzoin, benzoin methyl ether, benzoin ethyl ether, benzoin isopropyl ether, benzoin isobutyl ether, benzyldimethylketal, and the like, and combinations thereof.

Examples of the triazine-based compound may include without limitation 2,4,6-trichloro-s-triazine, 2-phenyl 4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxyphenyl)-4,6-bis(trichloromethyl)-s-triazine, 2-(p-tolyl)-4,6-bis(trichloro methyl)-s-triazine, 2-biphenyl 4,6-bis(trichloro methyl)-s-triazine, bis(trichloromethyl)-6-styryl-s-triazine, 2-(naphto-1-yl)-4,6-bis(trichloromethyl)-s-triazine, 2-(4-methoxynaphto-1-yl)-4,6-bis(trichloromethyl)-s-triazine, 2-4-tri chloromethyl(piperonyl)-6-triazine, 2-4-trichloromethyl (4'-methoxystyryl)-6-triazine, and the like, and combinations thereof.

Examples of the oxime-based compound may include without limitation 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, and the like, and combinations thereof.

Among the aforementioned ultraviolet (UV) absorbers, a compound having a maximum absorption wavelength ranging from about 300 to about 400 nm may be appropriately selected.

In addition to, or other than the ultraviolet (UV) absorbers, a carbazole-based compound, a diketone compound, a sulfonium borate-based compound, a diazo-based compound, a biimidazole-based compound, and the like, and combinations thereof, may be used as the ultraviolet (UV) absorber, if these compounds have a maximum absorption wavelength ranging from about 300 to about 400 nm.

In the present invention, the ultraviolet (UV) absorber may be an intermolecular hydrogen abstraction type. The ultraviolet (UV) absorber in a triplet state is combined with a hydrogen donor and forms a complex, in which a hydrogen atom moves to an ultraviolet (UV) absorber molecule and forms a radical.

The photosensitive resin composition may include the ultraviolet (UV) absorber in an amount of about 0.1 to about 5 parts by weight, for example about 1 to about 3 parts by weight, based on about 100 parts by weight of the alkali soluble resin. In some embodiments, the photosensitive resin composition may include the ultraviolet (UV) absorber in an amount of about 0.1, 0.2, 0.3, 0.4, 0.5, 0.6, 0.7, 0.8, 0.9, 1, 2, 3, 4, or 5 parts by weight. Further, according to some embodiments of the present invention, the amount of the ultraviolet (UV) absorber can be in a range from about any of the foregoing amounts to about any other of the foregoing amounts.

When the photosensitive resin composition includes the ultraviolet (UV) absorber in an amount within the above range, the ultraviolet (UV) absorber may easily regulate development rate balance of the photosensitive resin composition for an insulating film of a display device and effectively adjust sensitivity.

(D) Solvent

The photosensitive resin composition for an insulating film of a display device may include a solvent that is capable of easily dissolving each component.

Examples of the solvent may include without limitation N-methyl-2-pyrrolidone, γ-butyrolactone, N,N-dimethylacetamide, dimethylsulfoxide, diethyleneglycoldimethylether, diethylene glycoldiethylether, diethyleneglycoldibutylether, propyleneglycolmonomethylether, dipropyleneglycolmonomethylether, propyleneglycolmonomethyletheracetate, methyl lactate, ethyl lactate, butyl lactate, methyl-1,3-butyleneglycolacetate, 1,3-butyleneglycol-3-monomethylether, methyl pyruvate, ethyl pyruvate, methyl-3-methoxy propionate, and the like. The solvent may be used singularly or as a mixture of two or more.

The solvent may be used in an amount of about 100 to about 900 parts by weight, for example about 200 to about 700 parts by weight, based on about 100 parts by weight of the alkali soluble resin. When the photosensitive resin composition includes the solvent in an amount within the above range, a sufficiently thick film can be obtained, and good solubility and coating properties may be provided.

In one embodiment, the solvent may be used so that a solid content of the photosensitive resin composition for an insulating film of a display device is about 3 to 50 wt %, for example about 5 to about 30 wt %.

(E) Silane Compound

The photosensitive resin composition for an insulating film of a display device may further include a silane compound. The silane compound can improve adherence between the photosensitive resin composition for an insulating film of a display device and a substrate.

The silane compound may include a silane compound having a carbon-carbon unsaturated bond such as but not limited to compounds represented by the following Chemical Formulae 9 to 11; vinyltrimethoxysilane, vinyltriethoxysilane, vinyltrichlorosilane, vinyltris(β-methoxyethoxy)silane; 2-(3,4 epoxycyclohexyl)-ethyltrimethoxysilane, 3-methacryloxypropyltrimethoxysilane, 3-acryloxypropyltrimethoxysilane, p-styryltrimethoxysilane, 3-methacryloxypropylmethyldimethoxysilane, 3-methacryloxypropylmethyldiethoxysilane; trimethoxy[3-(phenylamino)propyl]silane, and the like, and combinations thereof.

[Chemical Formula 9]

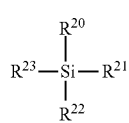

In Chemical Formula 9, $R^{20}$ is a vinyl group, substituted or unsubstituted alkyl, or substituted or unsubstituted aryl, for example 3-(meth)cryloxypropyl, p-styryl or 3-(phenylamino)propyl.

In Chemical Formula 9, $R^{21}$ to $R^{23}$ are the same or different and are each independently substituted or unsubstituted alkoxy, substituted or unsubstituted alkyl, or halogen, wherein at least one of $R^{21}$ to $R^{23}$ is alkoxy or halogen, and the alkoxy group may be C1 to C8 alkoxy, and the alkyl may be C1 to C20 alkyl.

[Chemical Formula 10]

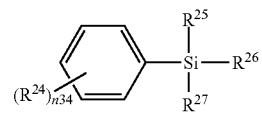

In Chemical Formula 10, each $R^{24}$ is independently —$NH_2$ or —$CH_3CONH$, $R^{25}$ to $R^{27}$ are the same or different and are each independently substituted or unsubstituted C1 to C20 alkoxy, wherein the alkoxy may be $OCH_3$ or $OCH_2CH_3$, and $n_{34}$ is an integer of 1 to 5.

[Chemical Formula 11]

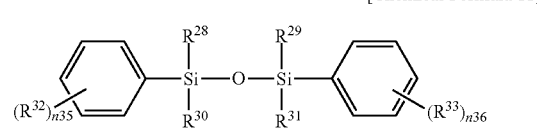

In Chemical Formula 11, $R^{28}$ to $R^{31}$ are the same or different and are each independently substituted or unsubstituted C1 to C20 alkyl or substituted or unsubstituted C1 to C20 alkoxy, for example $CH_3$ or $OCH_3$.

In Chemical Formula 11, $R^{32}$ and $R^{33}$ are the same or different and are each independently substituted or unsubstituted amino, for example $NH_2$ or $CH_3CONH$. $n_{35}$ and $n_{36}$ are the same or different and are each independently an integer ranging from 1 to 5.

The photosensitive resin composition may include the silane compound in an amount of about 0.1 parts by weight to about 30 parts, for example about 0.5 to about 10 parts by weight, based on about 100 parts by weight of the alkali soluble resin. In some embodiments, the photosensitive resin composition may include the silane compound in an amount of about 0.1, 0.2, 0.3, 0.4, 0.5, 0.6, 0.7, 0.8, 0.9, 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the silane compound can be in a range from about any of the foregoing amounts to about any other of the foregoing amounts.

When the silane compound is included in an amount within the above range, adherence between lower and upper layers can be sufficiently improved, residual film may not remain after development, and/or optical properties such as transmittance and mechanical properties such as tensile strength, elongation, and the like may be improved.

(F) Phenol Compound

The photosensitive resin composition for an insulating film of a display device may further include a phenol compound. The phenol compound can play a role of increasing dissolution rate and sensitivity of an exposed part and forming a pattern with a high resolution with minimal or no residue during the development using an alkali aqueous solution when the photosensitive resin composition is used to form the pattern.

The phenol compound may include a compound represented by the following Chemical Formulae 12 to 18, or a combination thereof, but is not limited thereto.

[Chemical Formula 12]

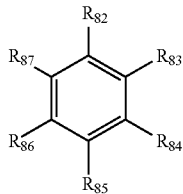

In Chemical Formula 12, $R_{82}$ to $R_{87}$ are the same or different and are each independently hydrogen, hydroxyl (OH), C1 to C8 substituted or unsubstituted alkyl, C1 to C8 alkoxyalkyl or —OCO—$R_{88}$, wherein $R_{88}$ is C1 to C8 substituted or unsubstituted alkyl, at least one of $R_{82}$ to $R_{87}$ is hydroxyl, and all $R_{82}$ to $R_{87}$ are not hydroxyl.

[Chemical Formula 13]

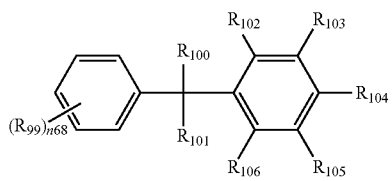

In Chemical Formula 13, $R_{99}$ to $R_{101}$ are the same or different and are each independently hydrogen or C1 to C8 substituted or unsubstituted alkyl, $R_{102}$ to $R_{106}$ are the same or different and are each independently H, OH, or C1 to C8 substituted or unsubstituted alkyl, for example the alkyl may be $CH_3$, and $n_{68}$ is an integer ranging from 1 to 5.

[Chemical Formula 14]

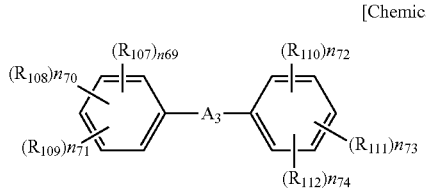

In Chemical Formula 14, $R_{107}$ to $R_{112}$ are the same or different and are each independently H, OH, or C1 to C8 substituted or unsubstituted alkyl, $A_3$ is $CR_{205}R_{206}$ or a single bond, wherein $R_{205}$ and $R_{206}$ are the same or different and are each independently hydrogen or C1 to C8 substituted or unsubstituted alkyl, for example $CH_3$, and $n_{69}+n_{70}+n_{71}$ and $n_{72}+n_{73}+n_{74}$ are the same or different and are each independently integers of less than or equal to 5.

[Chemical Formula 15]

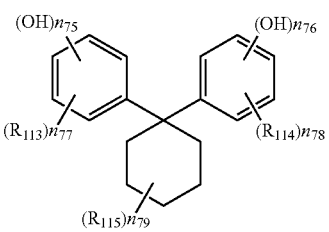

In Chemical Formula 15, $R_{113}$ to $R_{115}$ are the same or different and are each independently hydrogen or C1 to C8 substituted or unsubstituted alkyl, $n_{75}$, $n_{76}$ and $n_{79}$ are the same or different and are each independently integers ranging from 1 to 5, and $n_{77}$ and $n_{78}$ are the same or different and are each independently integers ranging from 0 to 4.

[Chemical Formula 16]

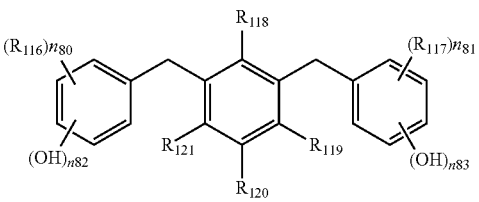

In Chemical Formula 16, $R_{116}$ to $R_{121}$ are the same or different and are each independently hydrogen, OH, or C1 to C8 substituted or unsubstituted alkyl, and $n_{80}$ to $n_{83}$ are the same or different and are each independently integers ranging from 1 to 4. $n_{80}+n_{82}$ and $n_{81}+n_{83}$ are the same or different and are each independently integers of less than or equal to 5.

[Chemical Formula 17]

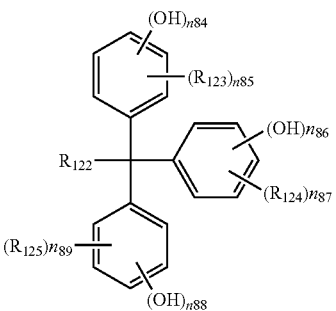

In Chemical Formula 17, $R_{122}$ is C1 to C8 substituted or unsubstituted alkyl, for example $CH_3$, $R_{123}$ to $R_{125}$ are the same or different and are each independently hydrogen or C1 to C8 substituted or unsubstituted alkyl, $n_{84}$, $n_{86}$ and $n_{88}$ are the same or different and are each independently integers of 1 to 5, and $n_{85}$, $n_{87}$ and $n_{89}$ are the same or different and are each independently integers ranging from 0 to 4. $n_{84}+n_{85}$, $n_{86}+n_{87}$ and $n_{88}+n_{89}$ are the same or different and are each independently integers of less than or equal to 5.

[Chemical Formula 18]

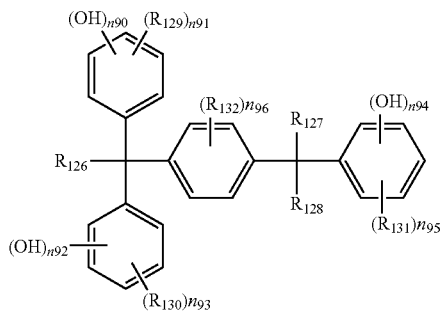

In Chemical Formula 18, $R_{126}$ to $R_{128}$ are the same or different and are each independently C1 to C8 substituted or unsubstituted alkyl, for example $CH_3$, $R_{129}$ to $R_{132}$ are the same or different and are each independently hydrogen or C1 to C8 substituted or unsubstituted alkyl, $n_{90}$, $n_{92}$ and $n_{94}$ are the same or different and are each independently integers ranging from 1 to 5, $n_{91}$, $n_{93}$ and $n_{95}$ are the same or different and are each independently integers ranging from 0 to 4, and $n_{96}$ is an integer ranging from 1 to 4. $n_{90}+n_{91}$, $n_{92}+n_{93}$ and $n_{94}+n_{95}$ are the same or different and are each independently integers of less than or equal to 5.

Examples of the phenol compound may include without limitation 2,6-dimethoxymethyl-4-t-butylphenol, 2,6-dimethoxymethyl-p-cresol, 2,6-diacetoxymethyl-p-cresol, and the like, and combinations thereof.

The photosensitive resin composition may include the phenol compound in an amount of about 1 to about 30 parts by weight based on about 100 parts by weight of the alkali soluble resin. In some embodiments, the photosensitive resin composition may include the phenol compound in an amount of about 1, 2, 3, 4, 5, 6, 7, 8, 9, 10, 11, 12, 13, 14, 15, 16, 17, 18, 19, 20, 21, 22, 23, 24, 25, 26, 27, 28, 29, or 30 parts by weight. Further, according to some embodiments of the present invention, the amount of the phenol compound can be in a range from about any of the foregoing amounts to about any other of the foregoing amounts.

When the photosensitive resin composition includes the phenol compound in an amount within the above range, the photosensitive resin composition may not deteriorate sensitivity but appropriately increase dissolution rate of a non-exposed part during the development, resultantly obtaining a good pattern. In addition, when the phenol compound is not extracted during the storage in a freezer, excellent storage stability may be accomplished.

(G) Other Additive(s)

The photosensitive resin composition for an insulating film of a display device according to one embodiment may further include one or more other additives.

The photosensitive resin composition for an insulating film of a display device may include an additive such as malonic acid; 3-amino-1,2-propanediol; and/or a silane coupling agent having a vinyl group or a (meth)acryloxy group in order to prevent staining of the film during coating, leveling improvement, or residues production due to non-development. The amount of the additive(s) may be controlled depending on desired properties and can be readily determined by the skilled artisan without undue experimentation.

The photosensitive resin composition for an insulating film of a display device may further include an additive of an epoxy compound in order to improve adherence with a substrate. Examples of the epoxy compound may include without limitation epoxy novolac acryl carboxylate resins, ortho cresol novolac epoxy resins, phenol novolac epoxy resins, tetramethyl biphenyl epoxy resins, bisphenol A epoxy resins, alicyclic epoxy resins, and the like, and combinations thereof.

When the epoxy compound is further used, a radical polymerization initiator such as a peroxide initiator or an azobis-based initiator may be further used.

The photosensitive resin composition may include the epoxy compound in an amount of about 0.01 to about 5 parts by weight based on about 100 parts by weight of the photosensitive resin composition for an insulating film of a display device. When the photosensitive resin composition includes the epoxy compound in an amount within the above range, storage and adherence and other characteristics may be improved economically.

The photosensitive resin composition may also include a latent thermal acid generator. The latent thermal acid generator is a catalyst for a dehydration reaction and a cyclization reaction of the polybenzoxazole precursor that is polyamide including a phenolic hydroxy group, and thus a cyclization reaction may be performed smoothly even if curing temperature is decreased.

Examples of the latent thermal acid generator may include without limitation aryl sulfonic acids such as p-toluene sulfonic acid, benzene sulfonic acid, and the like; perfluoroalkyl sulfonic acids such as trifluoromethane sulfonic acid, trifluorobutane sulfonic acid, and the like; alkyl sulfonic acids such as methane sulfonic acid, ethane sulfonic acid, butane sulfonic acid, and the like; and combinations thereof.

In addition, an additive such as a suitable surfactant and/or leveling agent may be included in order to prevent staining of the film or to improve development.

A method of preparing the photosensitive resin composition for an insulating film of a display device is not particularly limited. The photosensitive resin composition may be prepared by mixing the alkali soluble resin (A), the photosensitive diazoquinone compound (B), the UV absorber (C), solvent, and optionally the additive(s) to prepare a photosensitive resin composition for an insulating film of a display device.

According to another embodiment, an insulating film of a display device manufactured using the photosensitive resin composition for an insulating film of a display device is provided.

The insulating film of a display device may be formed according to the following method. The photosensitive resin composition can be coated on the surface of a substrate using a spraying method, a roll coater method, a spinning coating method, or the like. The coated substrate can be pre-baked and solvent removed to form a coating film. The pre-baking step can be performed at a temperature ranging from about 70 to about 120° C. for about 1 to about 5 minutes. Then, the pre-baked coating film can be radiated by a visible ray, ultraviolet (UV), far ultraviolet (UV), an electron beam, far ultraviolet (UV), an x-ray, and the like according to a predetermined pattern and then, developed to remove an unnecessary part, obtaining the predetermined pattern. As used herein, the development solution may include an alkali aqueous solution.

Examples of the development solution can include without limitation inorganic alkalis such as sodium hydroxide, potassium hydroxide, sodium carbonate, and the like; primary amines such as ethylamine, n-propylamine, and the like; secondary amines such as diethylamine, and the like; tertiary amines such as trimethylamine, methyldiethylamine, dimethylethylamine, triethylamine, and the like; alcohol amines such as dimethylethanolamine, methyl diethanolamine, triethanolamine, and the like; a quaternary ammonium salt aqueous solutions such as tetramethylammonium hydroxide, tetraethylammonium hydroxide, and the like; and mixtures thereof. The development solution can include an alkali compound in a concentration of about 0.1 to about 10%. In addition, a water-soluble organic solvent such as methanol ethanol and the like and/or a surfactant along with the solvent may be used in an appropriate amount. Accordingly, the insulating film can be developed with the development solution and then, washed with ultra-pure water for about 30 to about 140 seconds to remove an unnecessary part and dried to obtain a pattern. The pattern can be radiated by a light such as ultraviolet (UV) and the like and heated at a temperature ranging from about 110 to about 250° C. for about 30 to about 120 minutes in an oven and the like, obtaining a final pattern.

According to another embodiment, a display device including the insulating film is provided. Examples of the display device may include without limitation liquid crystal displays, light emitting diodes, plasma displays, organic light emitting diodes (OLED), and the like.

The following examples illustrate the present invention in more detail. However, it is understood that the present invention is not limited by these examples.

Synthesis Example 1

Preparation of Polybenzoxazole Precursor 41.1 g of 2,6-bis[[[5-[1-(amino-4-hydroxyphenyl)-2,2,2-trifluoro-1-(trifluoromethyl)ethyl]-2-hydroxyphenyl]amino] methyl]-4-methylphenol is dissolved in 280 g of N-methyl-2-pyrrolidone (NMP) in a 4-necked flask equipped with an agitator, a thermometer, a nitrogen gas injector, and a cooler, while nitrogen gas is passed therethrough.

When the solid is completely dissolved, 9.9 g of pyridine is added to the solution, and another solution prepared by dissolving 13.3 g of 4,4'-oxydibenzoylchloride in 142 g of N-methyl-2-pyrrolidone (NMP) is slowly added thereto in a dropwise fashion for 30 minutes, while the temperature is maintained at 0 to 5° C. The mixture is reacted for 1 hour at the temperature ranging from 0 to 5° C. Then, the temperature is increased up to room temperature, and the reactant is agitated for one hour.

Then, 1.6 g of 5-norbornene-2,3-dicarboxyl anhydride is added to the agitated reactant at 70° C. for 24 hours, terminating the reaction.

The reaction mixture is added to a solution prepared by mixing water/methanol in a volume ratio of 10/1 to produce a precipitate. The precipitate is filtered, sufficiently washed with water, and vacuum-dried at 80° C. for greater than or equal to 24 hours, obtaining a polybenzoxazole precursor having a weight average molecular weight of 9,500.

Hereinafter, the following components are used in Examples.

(A) Alkali Soluble Resin

The polybenzoxazole precursor prepared according to Synthesis Example 1

(B) Photosensitive Diazoquinone Compound

The photosensitive diazoquinone represented by the following Chemical Formula 19

[Chemica Formula 19]

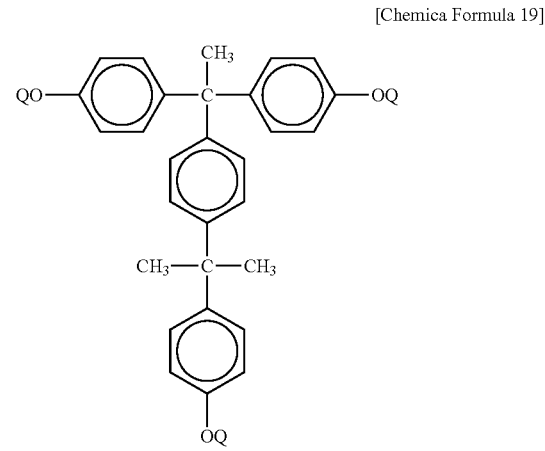

In the above Chemical Formula 19, two of three Q's are substituted with the following Chemical Formula 20, and the last one Q is substituted with hydrogen.

[Chemical Formula 20]

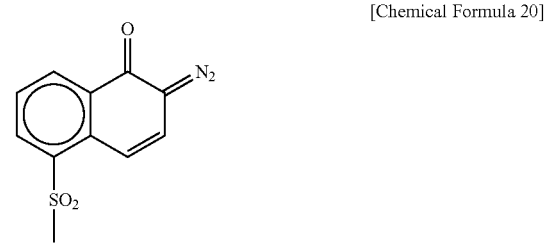

(C) Ultraviolet (UV) Absorber (C-1) 4,4'-bis(dimethylamino)benzophenone Represented by the Following Chemical Formula 21

[Chemical Formula 21]

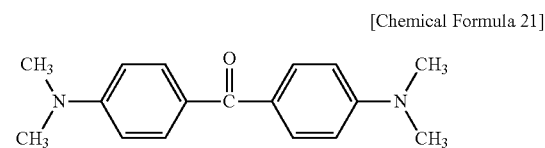

(C-2) 4,4'-bis(diethylamino)benzophenone Represented by the Following Chemical Formula 22

[Chemical Formula 22]

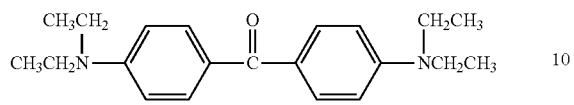

FIG. 1 shows the ultraviolet (UV) absorption spectra of the ultraviolet (UV) absorbers C-1 and C-2. Referring to FIG. 1, the ultraviolet (UV) absorber had a maximum absorption wavelength of 365 nm.

(D) Solvent (D-1) γ-butyrolactone (D-2) Propyleneglycolmonomethylether (PGME)

(E) Silane compound

Trimethoxy[3-(phenylamino)propyl]silane represented by the following Chemical Formula 23

[Chemical Formula 23]

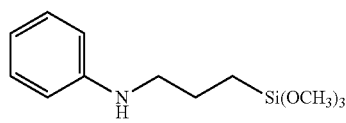

(F) Phenol Compound

A phenol compound represented by the following Chemical Formula 24

[Chemical Formula 24]

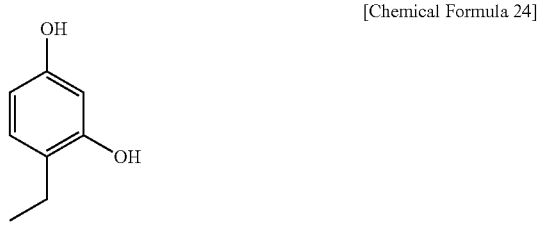

Examples 1 to 6 and Comparative Example 1

Each photosensitive resin composition for an insulating film of a display device is prepared by mixing the components in the amounts set forth in the following Table 1. Specifically, a photosensitive resin composition for an insulating film of a display device is prepared by dissolving an alkali soluble resin (A) in a solvent (D), adding a photosensitive diazoquinone compound (B), an ultraviolet (UV) absorber (C), a silane compound (E), and a phenol compound (F) thereto, and then, agitating the mixture for 3 hours at room temperature and filtering the agitated reactant with a 0.45 μm fluororesin filter.

TABLE 1

| | | Example 1 | Example 2 | Example 3 | Example 4 | Example 5 | Example 6 | Comparative Example 1 |
|---|---|---|---|---|---|---|---|---|
| (A) Alkali soluble resin | | 100 | 100 | 100 | 100 | 100 | 100 | 100 |
| (B) Photosensitive diazoquinone compound | | 10 | 10 | 10 | 10 | 10 | 10 | 10 |
| (C) Ultraviolet (UV) absorber | C-1 | 1 | 2 | 3 | — | — | — | — |
| | C-2 | — | — | — | 1 | 2 | 3 | — |
| (D) Solvent | D-1 | 100 | 100 | 100 | 100 | 100 | 100 | 100 |
| | D-2 | 250 | 250 | 250 | 250 | 250 | 250 | 250 |
| (E) Silane compound | | 0.2 | 0.2 | 0.2 | 0.2 | 0.2 | 0.2 | 0.2 |
| (F) Phenol compound | | 7.5 | 7.5 | 7.5 | 7.5 | 7.5 | 7.5 | 7.5 |

In Table 1, the units of the amounts of the components (B) to (F) are parts by weight based on 100 parts by weight of the component (A).

Fabrication of Pattern Film

The photosensitive resin compositions for an insulating film of a display device according to Examples 1 to 6 and Comparative Example 1 are respectively coated on an ITO glass with a spin coater and heated up to 130° C. for 2 minutes on a hot plate, forming coating films. Next, the coating films are exposed to a light using a predetermined pattern mask and an exposure equipment (1-line stepper, NSR i10C, Nikon Inc.) The exposed part is dissolved and removed in a 2.38% tetramethyl ammonium hydroxide aqueous solution at temperature for 40 seconds through 2 puddles, and the resultant is washed with distilled water for 30 seconds. Then, the obtained patterns are cured at 250° C. for 60 minutes under an oxygen concentration of less than or equal to 1000 ppm, obtaining pattern films.

Evaluation Examples

The pattern films are evaluated regarding film residue ratio, sensitivity, residue, and dielectric constant according to the following method. The results are provided in the following Table 2.

(1) Film Residue Ratio

The pre-baked films are developed in a 2.38% tetramethyl ammonium hydroxide (TMAH) aqueous solution at 23° C. for 60 seconds, washed with ultra-pure water for 60 seconds, and dried and then measured regarding thickness change using an Alpha step (Tencor Co.) and calculated according to the following Equation 1.

Film residue ratio=(thickness after development/initial thickness before development)×100    [Equation 1]

(OO: excellent film residue ratio of greater than or equal to 90%, Δ: medium film residue ratio of 80-90%, X: low film residue ratio of less than or equal to 80%)

(2) Sensitivity

Optimal exposure time of the pattern film is obtained by measuring exposure time taking to form a 10 μm L/S pattern to have a line width of 1:1 after the exposure and development. A minimum pattern dimension in the optimal exposure time is obtained as resolution of the pattern film.

(OO: excellent sensitivity of less than or equal to 50 mJ/cm$^2$, Δ: medium sensitivity of 50-200 mJ/cm$^2$, X: low sensitivity of greater than or equal to 200 mJ/cm$^2$)

(3) Residue

Residue of the pattern formed by using the photosensitive resin composition is obtained using an optical microscope and CD-SEM.

(Occurrence: high residue, medium occurrence: medium residue, no occurrence: no residue)

(4) Dielectric Constant

The resin composition is coated on an ITO glass and treated at 130° C. for 2 minutes on a hot plate, forming a 2.0-2.5 μm-thick coating film. Next, a metal electrode (Au) having a diameter of 300 μm is deposited on the coating film. Then, a dielectric constant is calculated by measuring capacitance with a precision impedance analyzer (HP 4294A) and using the following equation 2.

$C = \in_0 \times \in \times A/d$    [Equation 2]

In the equation 2, C denotes capacitance, $\in_0$ denotes a dielectric constant under vacuum, $\in$ denotes a non-dielectric ratio, A denotes an electrode area, and d denotes thickness of a photosensitive resin composition.

(O: dielectric constant of less than or equal to 5.5, X: dielectric constant of greater than 5.5)

TABLE 2

| | Film residue ratio | Sensitivity | Residue | Dielectric constant |
|---|---|---|---|---|
| Example 1 | ○ | ○ | None | ○ |
| Example 2 | ○ | ○ | None | ○ |
| Example 3 | ○ | ○ | None | ○ |
| Example 4 | ○ | ○ | None | ○ |
| Example 5 | ○ | ○ | None | ○ |
| Example 6 | ○ | ○ | None | ○ |
| Comparative Example 1 | ○ | Δ | Occur | ○ |

Referring to the evaluation example, the photosensitive resin composition according to the present invention appropriately regulated development rate of an exposed part and realized sensitivity (EOP) where no film residue remained. Accordingly, no residue occurred over the entire region of the exposed part having various film differences.

As shown in Table 2, the film according to Comparative Example 1 has a severe film residue in the exposed part, while the films according to Examples 1 to 6 maintain excellent film residue ratio and sensitivity of a non-exposed part and an excellent dielectric constant, while the film residue of the exposed part is removed.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A photosensitive resin composition for an insulating film of a display device, comprising
   (A) an alkali soluble resin including a polybenzoxazole precursor, polyamic acid, polyimide, or a combination thereof;
   (B) about 5 to about 100 parts by weight of a photosensitive diazoquinone compound;
   (C) about 0.1 to about 5 parts by weight of an ultraviolet (UV) absorber having maximum absorption wavelength of about 300 to about 400 nm; and
   (D) about 100 to about 900 parts by weight of about 100 to about 900 parts by weight of a solvent, each based on about 100 parts by weight of the alkali soluble resin (A); and
   a phenol compound,
   wherein the ultraviolet (UV) absorber (C) is benzophenone, benzoyl benzoate, benzoyl methyl benzoate, 4-phenyl benzophenone, hydroxy benzophenone, acrylated benzophenone, 4,4'-bis(dimethyl amino)benzophenone, 4,4'-bis(diethylamino)benzophenone, 4,4'-dimethylaminobenzophenone, 3,3'-dimethyl-2-methoxybenzophenone, 2,2'-diethoxyacetophenone, 2,2'-dibutoxyacetophenone, 2-hydroxy-2-methylpropiophenone, 2-methyl-1-(4-(methylthio)phenyl)-2-morpholinopropan-1-one, 2-benzyl-2-dimethylamino-1-(4-morpholinophenyl)-butan-1-one, thioxanthone, 2-methylthioxanthone, isopropyl thioxanthone, 2,4-diethyl thioxanthone, 2,4-diisopropyl thioxanthone, benzoin, benzoin methyl ether, benzoin ethyl ether, benzoin isopropyl ether, benzoin isobutyl ether, benzyldimethylketal, 2-(o-benzoyloxime)-1-[4-(phenylthio)phenyl]-1,2-octandione, 1-(o-acetyloxime)-1-[9-ethyl-6-(2-methylbenzoyl)-9H-carbazol-3-yl]ethanone, or a combination thereof.

2. The photosensitive resin composition for an insulating film of a display device of claim 1, wherein: the photosensitive resin composition for an insulating film of a display device further comprises a silane compound.

3. An insulating film of a display device manufactured using the photosensitive resin composition for an insulating film of a display device using claim 1.

4. A display device comprising of the insulating film of a display device according to claim 3.

5. The photosensitive resin composition for an insulating film of a display device of claim 1, wherein the ultraviolet (UV) absorber (C) is 4,4'-bis(dimethylamino)benzophenone.

6. The photosensitive resin composition for an insulating film of a display device of claim 1, wherein the ultraviolet (UV) absorber (C) is 4,4'-bis(diethylamino)benzophenone.

* * * * *